(12) United States Patent
Huang et al.

(10) Patent No.: US 12,727,263 B2
(45) Date of Patent: Sep. 1, 2026

(54) BACKSIDE ILLUMINATION IMAGING SENSOR AND METHODS OF MANUFACTURING

(71) Applicant: Taiwan Semiconductor Manufacturing Company, Ltd., Hsinchu (TW)

(72) Inventors: Yu-Wei Huang, Tainan City (TW); Chen-Hsien Lin, Tainan City (TW); Yu-Ting Chen, Wanluan Township (TW); Shu-Ting Tsai, Kaohsiung City (TW); Tzu-Hsuan Hsu, Kaohsiung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 576 days.

(21) Appl. No.: 17/816,257

(22) Filed: Jul. 29, 2022

(65) Prior Publication Data

US 2024/0038818 A1 Feb. 1, 2024

(51) Int. Cl.
*H10F 39/12* (2025.01)
*H10F 39/00* (2025.01)
*H10F 39/18* (2025.01)

(52) U.S. Cl.
CPC ......... *H10F 39/199* (2025.01); *H10F 39/024* (2025.01); *H10F 39/18* (2025.01); *H10F 39/8053* (2025.01); *H10F 39/807* (2025.01); *H10F 39/811* (2025.01)

(58) Field of Classification Search
CPC ........... H01L 27/1464; H01L 27/14621; H01L 27/1463; H01L 27/14636; H01L 27/14643; H01L 27/14685
USPC ........................................................ 257/432
See application file for complete search history.

(56) References Cited

U.S. PATENT DOCUMENTS 9,871,070 B2 1/2018 Hsu et al.
9,985,072 B1 5/2018 Wen et al.
11,784,202 B2 * 10/2023 Lee ........................ H10F 39/18 257/432

(Continued)

FOREIGN PATENT DOCUMENTS

TW 201729408 A 8/2017
TW 201830679 A 8/2018

*Primary Examiner* — Eliseo Ramos Feliciano
*Assistant Examiner* — Timothy Edward Duren
(74) *Attorney, Agent, or Firm* — Harrity & Harrity, LLP

(57) ABSTRACT

Some implementations described herein provide for techniques to form a biased backside deep trench isolation and grid structure for a backside illumination image sensor. The techniques include forming an array of backside deep trench isolation structures and a biasing-pad that electrically connects to the array of metal-filled backside deep trench isolation structures through the grid structure. The array of backside deep trench isolation structures, the grid structure, and the biasing-pad structure may reduce a likelihood of electrical cross-talk and/or oblique light cross-talk between the photodiodes of the backside illumination image sensor. In this way, a performance of the backside illumination image sensor may be improved. Such improvements may include a suppression of a dark current within the backside illumination image sensor, a reduction in a number of white pixels, and a reduction in cross-talk within the backside illumination image sensor.

20 Claims, 17 Drawing Sheets

(56) References Cited

U.S. PATENT DOCUMENTS

| | | | | |
|---|---|---|---|---|
| 11,791,362 | B2 * | 10/2023 | Kim | H10F 39/8063 257/432 |
| 2015/0255495 | A1 * | 9/2015 | Park | H10F 39/807 257/446 |
| 2019/0027518 | A1 * | 1/2019 | Miyata | H10F 39/8053 |
| 2019/0131339 | A1 * | 5/2019 | Chiang | H10F 39/8053 |
| 2020/0027909 | A1 * | 1/2020 | Ebiko | G01S 17/88 |
| 2020/0227455 | A1 * | 7/2020 | Lee | H10F 39/18 |
| 2021/0225918 | A1 * | 7/2021 | Lin | H10F 39/014 |
| 2021/0366954 | A1 | 11/2021 | Chen et al. | |
| 2022/0052096 | A1 | 2/2022 | Lin et al. | |
| 2022/0139989 | A1 * | 5/2022 | Park | H10F 39/8063 257/432 |

* cited by examiner 320
316
406
314
208
210
206
A
A
402
404
400

BACKSIDE ILLUMINATION IMAGING SENSOR AND METHODS OF MANUFACTURING

BACKGROUND

Digital cameras and other optical imaging devices employ image sensors. Image sensors convert optical images to digital data that may be represented as digital images. An image sensor includes an array of pixel sensors and supporting logic. The pixel sensors of the array are devices for measuring incident light, and the supporting logic facilitates read-out of the measurements. One type of image sensor commonly used in optical imaging devices is a back side illumination (BSI) image sensor. BSI image sensor fabrication can be integrated into semiconductor processes for low cost, small size, and high integration. Furthermore, BSI image sensors have low operating voltage, low power consumption, high quantum efficiency, and low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
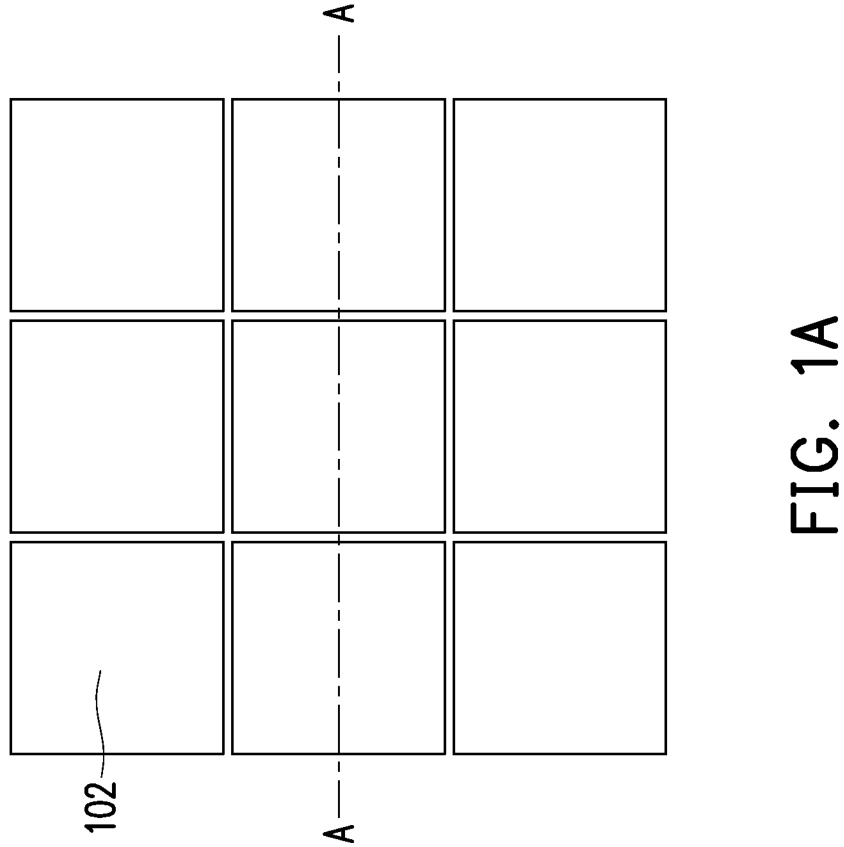
FIGS. 1A and 1B are diagrams of an example pixel array described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, techniques may be used to reduce cross-talk between adjacent pixel sensors of a BSI image sensor. One example technique includes forming separate backside deep isolation trench (BDTI) structures and grid structures that are floating and without bias. Such a technique may facilitate a leakage of an electrical charge (e.g., electrical cross-talk) and/or light (e.g., oblique light cross-talk) between neighboring photodiodes to degrade a performance of the BSI image sensor. Furthermore, etching processes used to form the BDTI structures may cause plasma damage in silicon bulk by creating an energy band gap (interface defects) that has a high correlation to pixel leakage. As such, separate BDTI structures and grid structures that are floating without bias may be prone to a reduced manufacturing yield and/or malfunctions during field use, which may ultimately consume additional resources to fabricate more BSI image sensors.

Some implementations described herein provide for techniques to form a biased backside deep trench isolation (BDTI) and grid structure for a backside illumination images (BSI) sensor. The techniques include forming an array of BDTI structures and a biasing-pad structure that electrically connects the array of BDTI structures through the grid structure. The array of BDTI structures, the grid structure, and the biasing-pad structure may reduce a likelihood of electrical cross-talk and/or oblique light cross-talk between the photodiodes of the BSI image sensor.

In this way, a performance of the BSI image sensor may be improved. Such improvements may include a suppression of a dark current within the BSI image sensor, a reduction in a number of white pixels, and a reduction in cross-talk within the BSI image sensor.

Figure 1B:
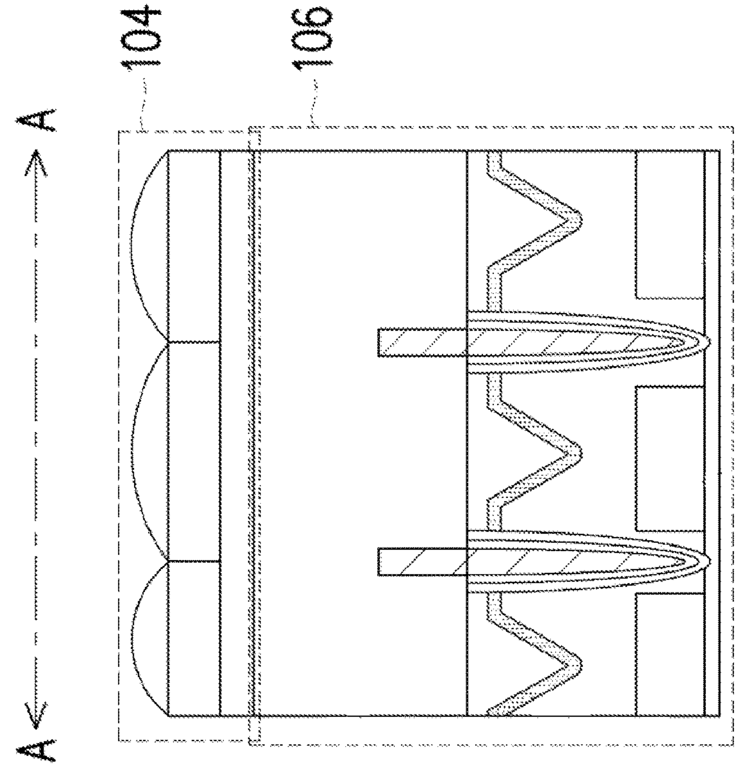

FIGS. 1A and 1B are diagrams of an example pixel array 100 described herein. The pixel array 100 may be included in an image sensor, such as a complementary metal oxide semiconductor (CMOS) image sensor, a back side illuminated (BSI) CMOS image sensor, or another type of image sensor.

FIG. 1A shows a top-down view of the pixel array 100. As shown in FIG. 1A, the pixel array 100 may include a plurality of pixel sensors 102. As further shown in FIG. 1A, the pixel sensors 102 may be arranged in a grid. In some implementations, the pixel sensors 102 are square-shaped (as shown in the example in FIG. 1A). In some implementations, the pixel sensors 102 include other shapes such as circle shapes, octagon shapes, diamond shapes, and/or other shapes.

The pixel sensors 102 may be configured to sense and/or accumulate incident light (e.g., light directed toward the pixel array 100). For example, a pixel sensor 102 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

FIG. 1B shows a cross-sectional view of the pixel array 100 along line A-A of FIG. 1A. The pixel array 100 may be included in an image sensor such as a complementary metal-oxide semiconductor (CMOS) image sensor, a BSI CMOS image sensor, or another type of image sensor. Such an image sensor may be configured to be deployed in various implementations, such as digital cameras, video recorders, night-vision cameras, automotive sensors and cameras, and/or other types of light-sensing implementations.

The pixel array 100 may include a color filter array region 104 (e.g., a combination of lenses and filters) over a sensing region 106. As described in greater detail in connection with FIGS. 2A and 2B and elsewhere herein, the sensing region 106 may correspond to a semiconductor structure including one or more structures such as photodiode structures, biased backside deep trench isolation (BDTI) isolation structures, recess lining structures, and/or grid structures, among other examples.

As indicated above, FIGS. 1A and 1B are provided as examples. Other examples may differ from what is described with regard to FIGS. 1A and 1B.

Figure 2A:
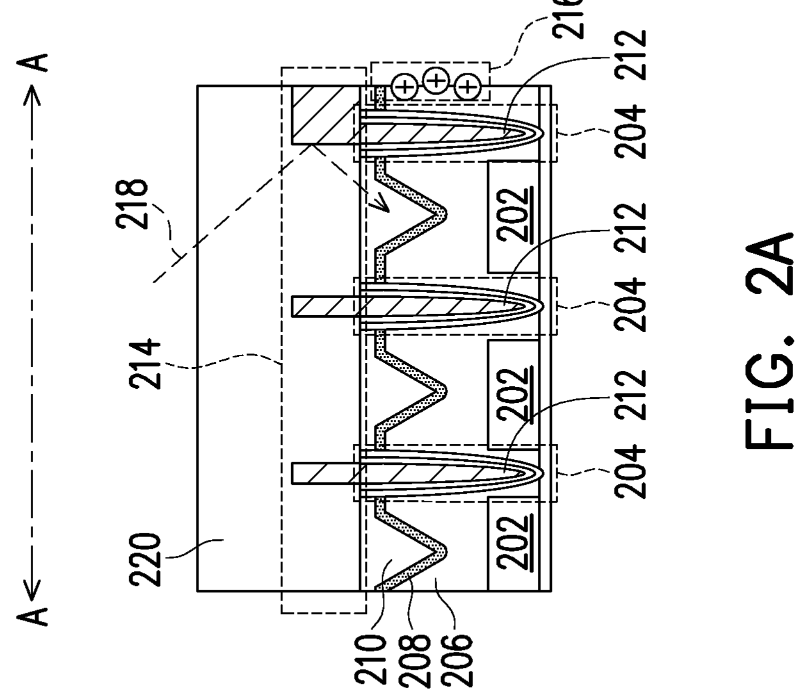
FIGS. 2A and 2B are diagrams of an example semiconductor structure described herein.
Figure 2B:
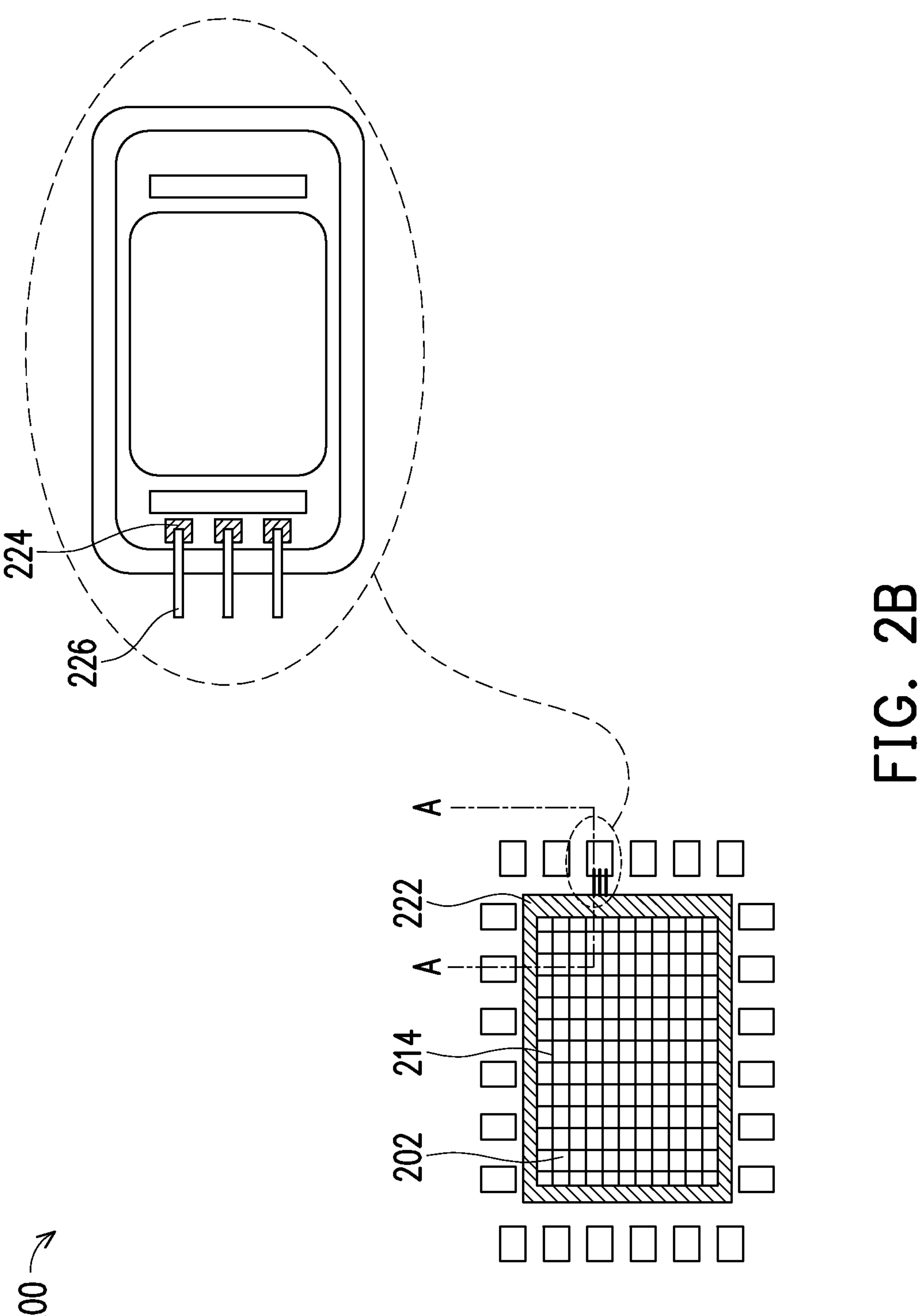

FIGS. 2A and 2B are diagrams of an example semiconductor structure 200 described herein. The example semiconductor structure 200 may include one or more portions of the sensing region 106 of FIG. 1. Additionally, or alternatively, the semiconductor structure 200 may correspond to a biased backside deep trench isolation (BDTI) and grid structure for a backside illumination (BSI) sensor (e.g., a device or a semiconductor device).

FIG. 2A shows a section view A-A including the example semiconductor structure 200. As described in greater detail in connection with FIGS. 3A-10 and elsewhere herein, the example semiconductor structure 200 includes photodiode structures 202. In some implementations, the photodiode structures 202 correspond to an array of photodiode structures (e.g., an inverted pyramid array for a near-infrared light (NIR) application, among other examples).

The semiconductor structure 200 includes isolation regions 204. The isolation regions 204 may extend into at least a portion of a silicon layer 206 (e.g., each isolation region extends into at least a portion of the silicon layer 206). Additionally, or alternatively, the isolation regions 204 may extend through a dielectric layer 208. The dielectric layer may include a high-k dielectric material such as tantalum oxide ($Ta_2O_5$) or hafnium oxide ($HfO_2$), among other examples. Additionally, or alternatively, the isolation regions 204 may extend though an oxide layer 210. The oxide layer 210 may include a silicon dioxide ($SiO_2$) material, among other examples.

The isolation regions 204 are filled with metal structures 212 (e.g., a metal structure extends into an isolation region). The metal structures 212 may include a conductive metal material such as a tungsten (W) material, among other examples. In some implementations, the isolation regions 204 in combination with the metal structures 212 correspond to an array of backside deep trench isolation (BDTI) structures. In some implementations, the metal structures 212 correspond to an array of metal structures. Furthermore, and as shown in FIG. 2A, the metal structures 212, and the isolation regions 204, may be dispersed between the photodiode structures 202. In other words, a BDTI structure (e.g., an isolation region filled with metal) may be between adjacent photodiodes.

The semiconductor structure 200 further includes a grid structure 214. The grid structure 214 may include a conductive metal material such as a tungsten (W) material, among other examples. The grid structure 214 may electrically connect the metal structures 212 with a source (e.g., a biasing pad, among other examples) that provides an electrical bias 216 to at least one of the metal structures 212. The electrical bias 216 may reduce a likelihood of electrical cross-talk between the photodiode structures 202. Additionally, or alternatively, the grid structure 214 may reflect electromagnetic waves 218 (e.g., light) to reduce a likelihood of oblique light cross-talk between the photodiode structures 202.

In some implementations, an oxide layer 220 may be on surfaces of the grid structure 214. The oxide layer 220 may include a silicon dioxide ($SiO_2$) material, among other examples. Additionally, or alternatively, a color filter array region (e.g., the color filter array region 104 of FIG. 1) may be over the grid structure 214.

FIG. 2B shows a top view including the example semiconductor structure 200. FIG. 2B also provides a reference location with respect to the section view A-A referred to in FIG. 2A and elsewhere herein.

In FIG. 2B, the grid structure 214 is over the array of the photodiode structures 202. Also, as shown in FIG. 2B, the grid structure 214 is surrounded by a metal shield structure 222. The semiconductor structure 200 includes a biasing-pad structure 224 electrically connected with the grid structure 214. In some implementations, and as shown in FIG. 2B, the metal shield structure 222 and/or a connector structure 226 electrically connects the biasing-pad structure 224 with the grid structure 214.

As described in greater detail in connection with FIGS. 3A-8, and as shown in FIGS. 2A and 2B, a device (e.g., a BSI image sensor including the semiconductor structure 200) may include an array of photodiode structures (e.g., the photodiode structures 202). The device may include an array of metal structures (e.g., the metal structures 212) dispersed between the array of photodiode structures. The device may include a biasing-pad structure (e.g., the biasing-pad structure 224) electrically connected with the array of metal structures through a grid structure (e.g., the grid structure 214).

Additionally, or alternatively, a device (e.g., a BSI image sensor including the semiconductor structure 200) may include a BDTI structure. The BDTI structure may include an isolation region (e.g., an instance of the isolation regions 204). The BDTI structure may further include a metal structure (e.g., an instance of the metal structures 212) that fills the isolation regions. The device may include a biasing-pad structure (e.g., the biasing-pad structure 224). The device may further include a grid structure (e.g., the grid structure 214) that electrically connects the metal structure and the biasing-pad structure.

As indicated above, FIGS. 2A and 2B are provided as examples. Other examples may differ from what is described with regards to FIGS. 2A and 2B.

Figure 3A:
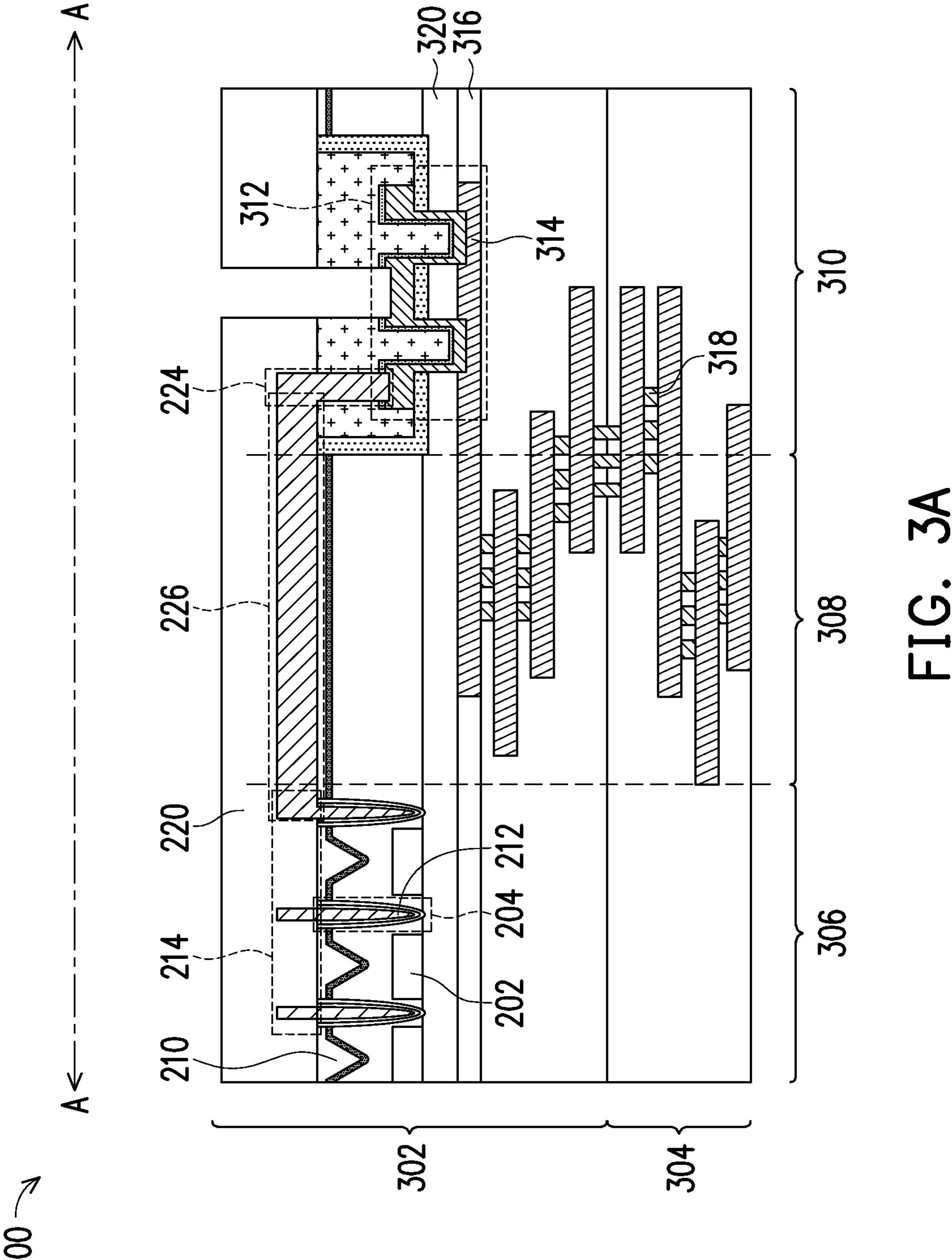
FIGS. 3A-3C are diagrams of example implementations described herein.
Figure 3B:
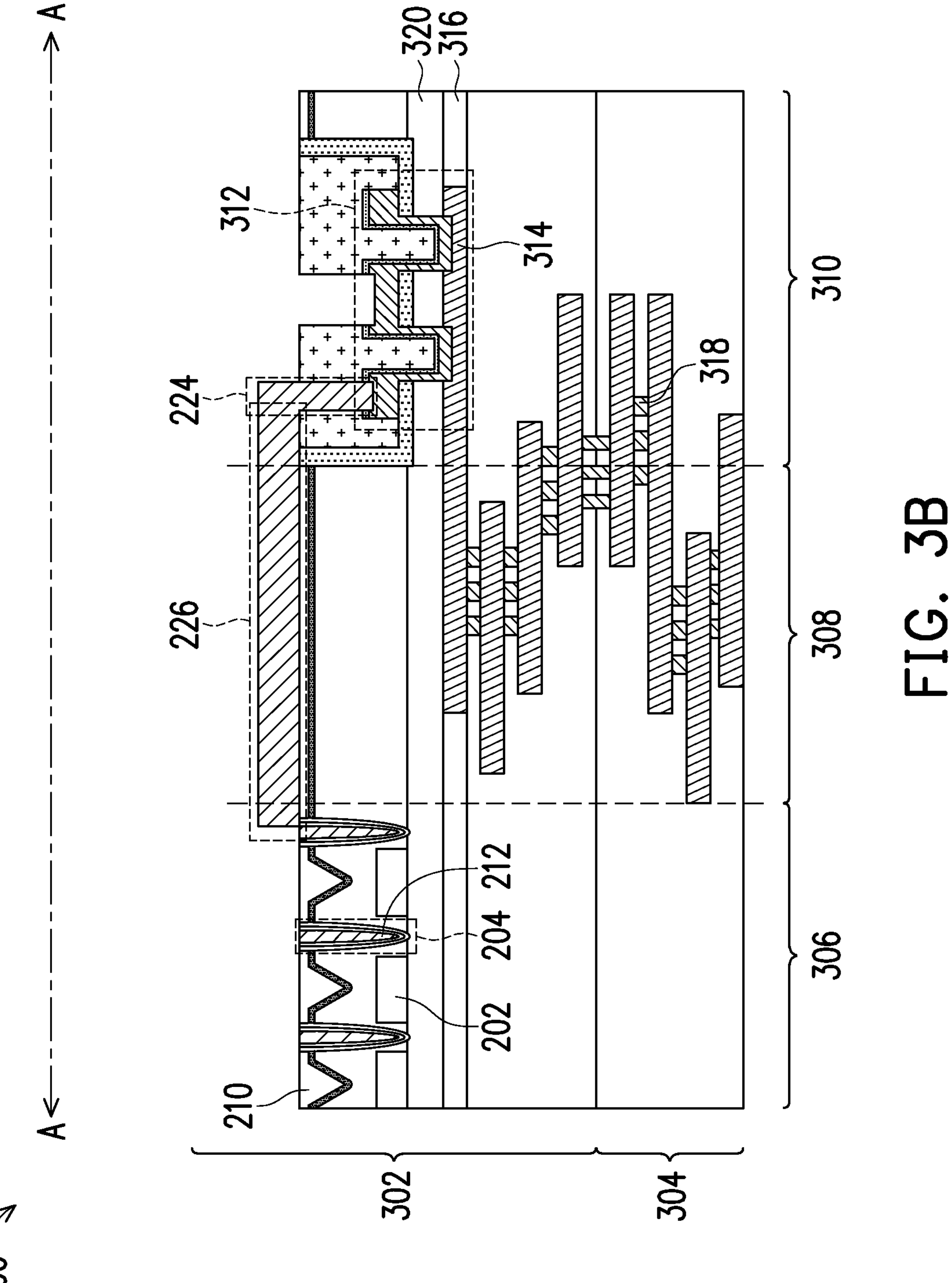
Figure 3C:
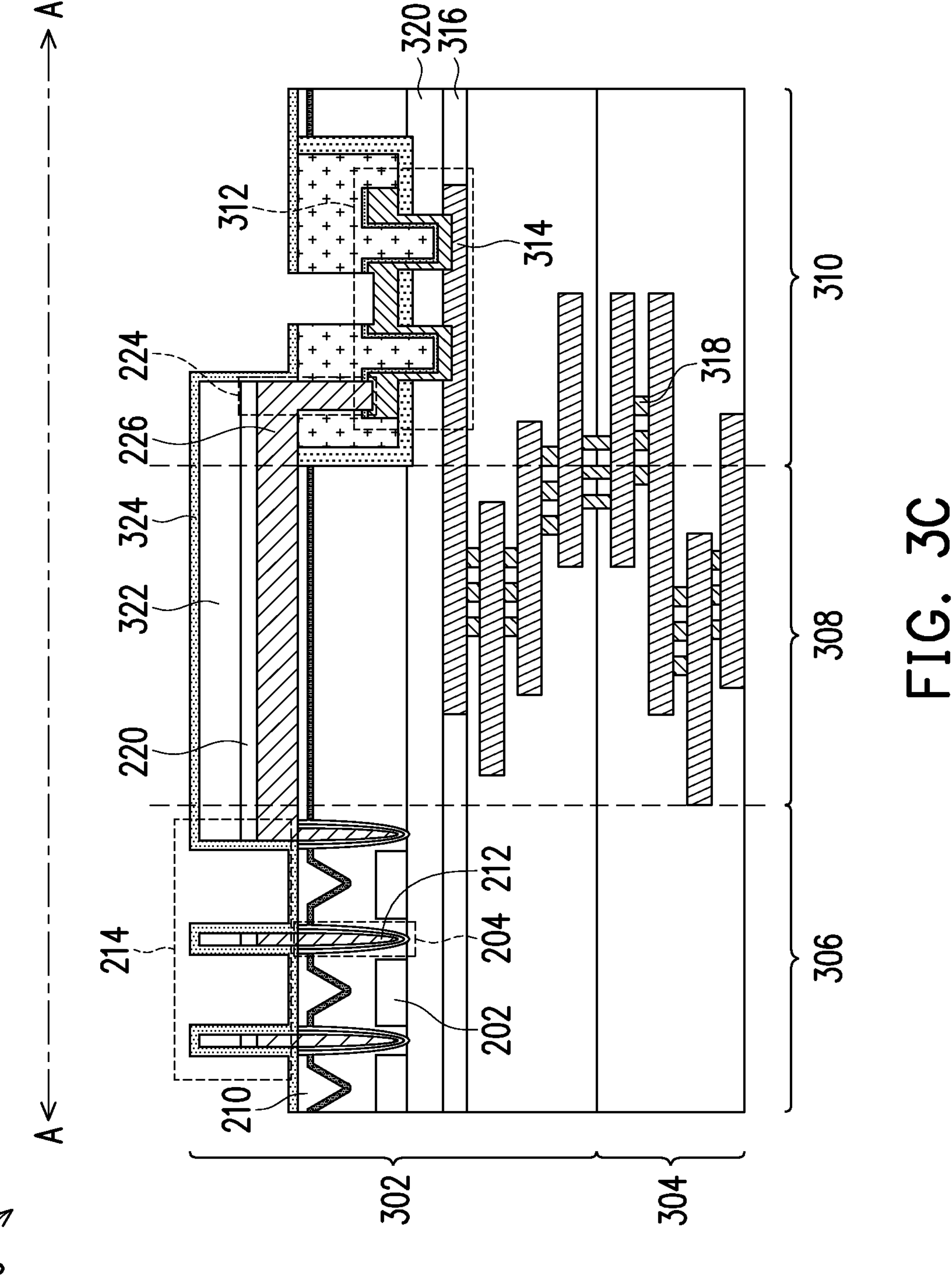

FIGS. 3A-3C are diagrams of example implementations 300 described herein. FIGS. 3A-3C include section views A-A of the semiconductor structure 200 integrated into an optical sensing device such as a BSI image sensor. The BSI image sensor may include a system-on-chip (SoC) device 302 and an application-specific integrated circuit (ASIC) device 304. The BSI image sensor may include one or more regions, including a pixel array region 306, a periphery region 308, and a pad region 310. A pad metal structure 312 may be included within the pad region 310.

In some implementations, the SoC device 302 and the ASIC device 304 include one or more metal layers 314, one or more intermetal dielectric (IMD) layers 316, one or more interconnect access structures 318 (e.g., vertical interconnect access structures connecting the one or more metal layer 314) and one or more interlayer dielectric (ILD) layers 320. However, other layers, features, or structures within the BSI image sensor are within the scope of the present disclosure.

FIG. 3A includes the photodiode structures 202, the isolation regions 204, and the metal structures 212 located in the pixel array region 306. FIG. 3A further shows the grid structure 214 located in the pixel array region 306 and the connector structure 226 located in the periphery region 308. FIG. 3A further shows the biasing-pad structure 224 located within the pad region 310 and electrically connected to a portion of the pad metal structure 312. Furthermore, as shown in FIG. 3A, the biasing-pad structure 224 is electrically connected to the metal structures 212 through the grid structure 214. In some implementations, and as shown in FIG. 3A, the biasing-pad structure 224 is electrically connected with the grid structure 214 through the connector structure 226. Additionally, or alternatively, the biasing-pad structure 224 is electrically connected with the grid structure 214 through the connector structure 226 and a metal shield structure (e.g., the metal shield structure 222, not shown).

As shown in FIG. 3A, the photodiode structures 202 are located within the pixel array region 306 and the biasing-pad structure 224 is located within a pad region 310. Furthermore, the periphery region 308 separates the pixel array region 306 and the pad region 310. In some implementations, and as shown in FIG. 3A, the connector structure 226 spans across the periphery region 308 as part of an electrical connection between the biasing-pad structure 224 and the metal structures 212.

In some implementations, and as shown in FIG. 3A, the grid structure 214 corresponds to a metal grid structure. Using techniques described in greater detail in connection with FIGS. 4A-4D and FIG. 5, the grid structure 214 (e.g., the metal grid structure) may extend above the isolation regions 204 that are filled with the metal structures 212.

Similarly to FIG. 3A, FIG. 3B includes the photodiode structures 202, the isolation regions 204, and the metal structures 212 located in the pixel array region 306. FIG. 3B further shows the biasing-pad structure 224 located within the pad region 310 and electrically connected with the pad metal structure 312. Furthermore, as shown in FIG. 3B, the biasing-pad structure 224 is electrically connected with the connector structure 226.

In some implementations, and as described in greater detail in connection with FIGS. 4A-4D and FIG. 7, the metal structures 212 may include top surfaces that are substantially coplanar with top edges of the isolation regions 204. Additionally, or alternatively, the metal structures 212 may include top surfaces that are substantially coplanar with a surface of the oxide layer 210.

The configuration shown in FIG. 3B, including the metal structures 212, the biasing-pad structure 224, and the connector structure 226, may be compatible with a type of grid structure such as a "Low-N" type of grid structure (e.g., a grid structure having a refractive index that is lower than that of a plurality of color filters formed over the array of photodiodes), among other examples. Such a type of grid structure (e.g., the Low-N type of grid structure) may be subsequently-formed as part of a color filter array (CFA) fabrication process, among other examples.

FIG. 3C includes the photodiode structures 202, the isolation regions 204, and the metal structures 212 located in the pixel array region 306. FIG. 3C further shows the grid structure 214 located in the pixel array region 306 and the connector structure 226 located in the periphery region 308. FIG. 3C further shows the biasing-pad structure 224 located within the pad region 310 and electrically connected with a portion of the pad metal structure 312. Furthermore, as shown in FIG. 3C, the biasing-pad structure 224 is electrically connected with the metal structures 212 through the grid structure 214. In some implementations, and as shown in FIG. 3C, the biasing-pad structure 224 is electrically connected with the grid structure 214 through the connector structure 226. Additionally, or alternatively, the biasing-pad structure 224 is electrically connected with the grid structure 214 through the connector structure 226 and a metal shield structure (e.g., the metal shield structure 222, not shown).

In some implementations, and as shown in FIG. 3C, the grid structure 214 corresponds to a composite grid structure. Using techniques described in greater detail in connection with FIGS. 4A-4D and FIG. 7, multiple layers of material may be part of the grid structure 214 (e.g., the composite grid structure), and/or over the connector structure 226. The multiple layers may include the oxide layer 220, a silicon oxynitride (SiON) layer 322, and/or an oxide layer 324, among other examples. In some implementations, the oxide layer 324 includes a silicon dioxide ($SiO_2$) material, among other examples.

As indicated above, FIGS. 3A-3C are provided as examples. Other examples may differ from what is described with regards to FIGS. 3A-3C.

FIGS. 4A-4F are diagrams of an example manufacturing process flow 400 described herein. In some implementations, the manufacturing process flow 400 uses one or more semiconductor processing tools to form portions of a BSI image sensor including the semiconductor structure 200. The one or more semiconductor processing tools may include a deposition tool, an exposure tool, a developer tool, and/or an etch tool, among other examples. Furthermore, FIGS. 4A-4F show a section view A-A of the manufacturing process flow 400 corresponding to the section A-A of FIG. 2B.

Figure 4A:
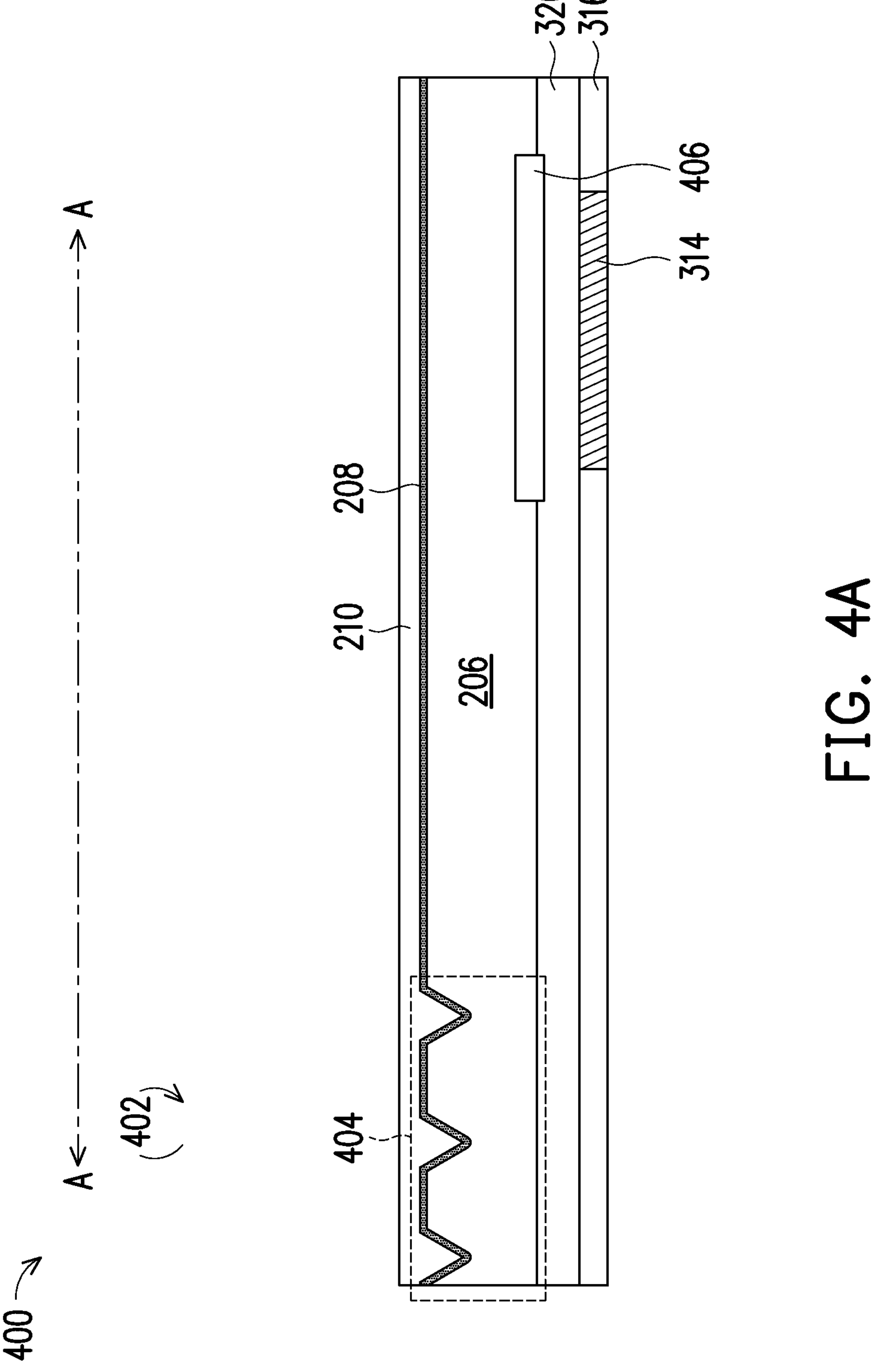
FIGS. 4A-4F, 5, 6, and 7 are diagrams of example manufacturing process flows described herein.

As shown in FIG. 4A and as part of the manufacturing process flow 400, one or more of the semiconductor processing tools may perform a combination of operations 402 to form an inverted pyramid array structure 404. The combination of operations 402 may include, for example, the deposition tool depositing the silicon layer 206, the dielectric layer 208, the oxide layer 210, the metal layer 314, the IMD layer 316, the ILD layer 320, and/or a shallow trench isolation (STI) layer 406 using a chemical vapor deposition (CVD) technique, a physical vapor deposition (PVD) technique, an atomic layer deposition (ALD) technique, an epitaxial growth technique, or another similar technique.

Additionally, or alternatively, the combination of operations 402 may include the deposition tool, the exposure tool, the developer tool, and the etch tool forming one or more features through a combination of techniques. For example, the deposition tool may use a spin coat technique to deposit a layer of a photoresist material and the exposure tool may expose a portion of the photoresist material using a UV or EUV exposure technique, among other examples. The combination of techniques may include the developer tool using a dissolving technique to develop the layer of photoresist material through use of a chemical developer and the etch tool forming a feature using a wet etch technique, a dry etch technique, and/or a plasma-assisted etch technique, among other examples. Such features may include tapered cavities used to form the inverted pyramid array structure 404. Additionally, or alternatively, such features may include a segment length of one or more of the silicon layer 206, the dielectric layer 208, the oxide layer 210, the metal layer 314, the IMD layer 316, the ILD layer 320, or the shallow trench isolation (STI) layer 406, among other examples.

Figure 4B:
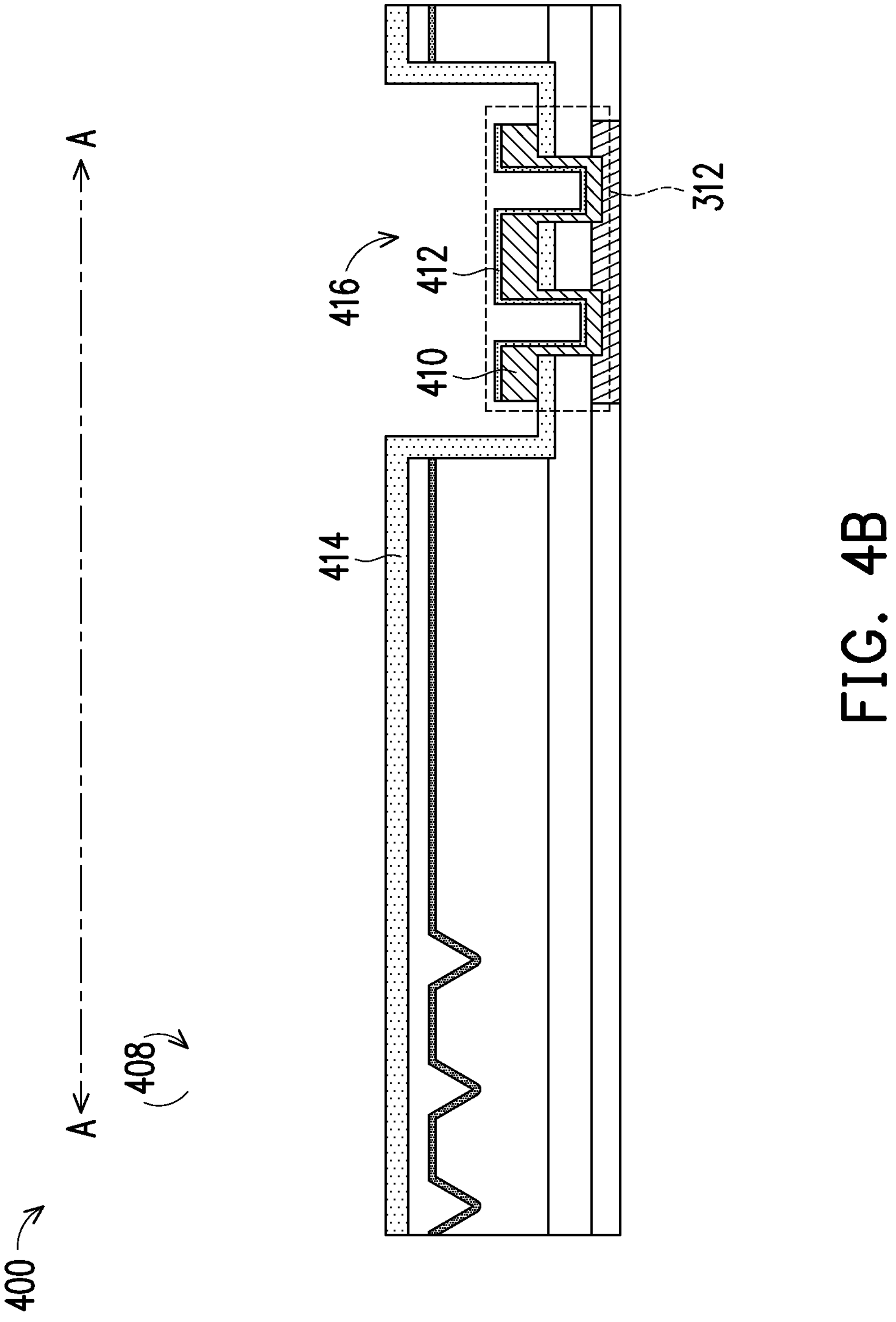

As shown in FIG. 4B and as part of the manufacturing process flow 400, one or more of the semiconductor processing tools may perform a combination of operations 408 to form the pad metal structure 312. The combination of operations 408 may include, for example, the deposition tool depositing a metal layer 410 (e.g., a metal layer including an aluminum copper (AlCu) material, among other examples), a protective layer 412 (e.g., a protective layer including a silicon dioxide ($SiO_2$) material or a silicon oxynitride (SiON) material, among other examples), and a buffer oxide layer 414 (e.g., a buffer oxide layer including a silicon dioxide ($SiO_2$) material, among other examples) using a CVD technique, a PVD technique, an ALD technique, an epitaxial growth technique, and/or another similar technique.

Additionally, or alternatively, the combination of operations 408 may include the deposition tool, the exposure tool, the developer tool, and the etch tool forming one or more features through a combination of techniques. For example, the deposition tool may use a spin coat technique to deposit a layer of a photoresist material and the exposure tool may expose a portion of the photoresist material using a UV or EUV exposure technique, among other examples. The combination of techniques may include the developer tool using a dissolving technique to develop the layer of photoresist material through use of a chemical developer and the etch tool forming a feature using a wet etch technique, a dry etch technique, or a plasma-assisted etch technique, among other examples. Such features may include a pad opening cavity 416. Additionally, or alternative, such features may include a segment length of one or more of the metal layer 410, the protective layer 412, or the buffer oxide layer 414, among other examples.

Figure 4C:
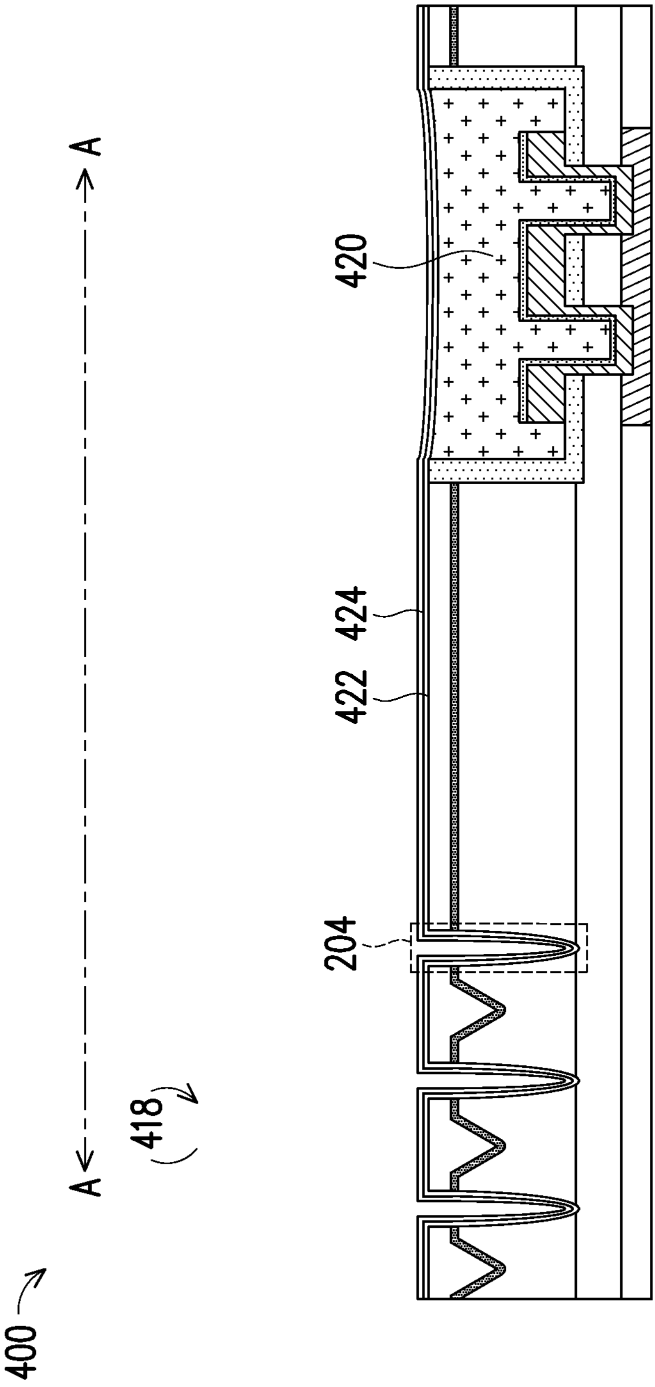

As shown in FIG. 4C and as part of the manufacturing process flow 400, one or more of the semiconductor processing tools may perform a combination of operations 418 that include forming the isolation regions 204. The combination of operations 418 may include, for example, the deposition tool depositing an oxide layer 420 (e.g., an oxide layer including a silicon dioxide ($SiO_2$) material or a silicon oxynitride (SiON) material, among other examples), a dielectric layer 422 (e.g., a dielectric layer including a high-k dielectric material such as a tantalum oxide ($Ta_2O_5$) material or a hafnium oxide ($HfO_2$) material, among other examples), and a buffer oxide layer 424 (e.g., a buffer oxide layer including a silicon dioxide ($SiO_2$) material, among other examples) using a CVD technique, a PVD technique, an ALD technique, an epitaxial growth technique, or another similar technique. As shown in FIG. 4C, an interior surface of the isolation regions 204 may be lined with the dielectric layer 422 and/or the buffer oxide layer 424.

Additionally, or alternatively, the combination of operations 418 may include the deposition tool, the exposure tool, the developer tool, and the etch tool forming one or more features through a combination of techniques. For example, the deposition tool may use a spin coat technique to deposit a layer of a photoresist material and the exposure tool may expose a portion of the photoresist material using a UV or EUV exposure technique, among other examples. The combination of techniques may include the developer tool using a dissolving technique to develop the layer of photoresist material through use of a chemical developer and the etch tool forming a feature using a wet etch technique, a dry etch technique, and/or a plasma-assisted etch technique, among other examples. Such features may include a cavity for forming the isolation regions 204. Additionally, or alternative, such features may include a segment length of one or more of the oxide layer 420, the dielectric layer 422, or the buffer oxide layer 424, among other examples.

Figure 4D:
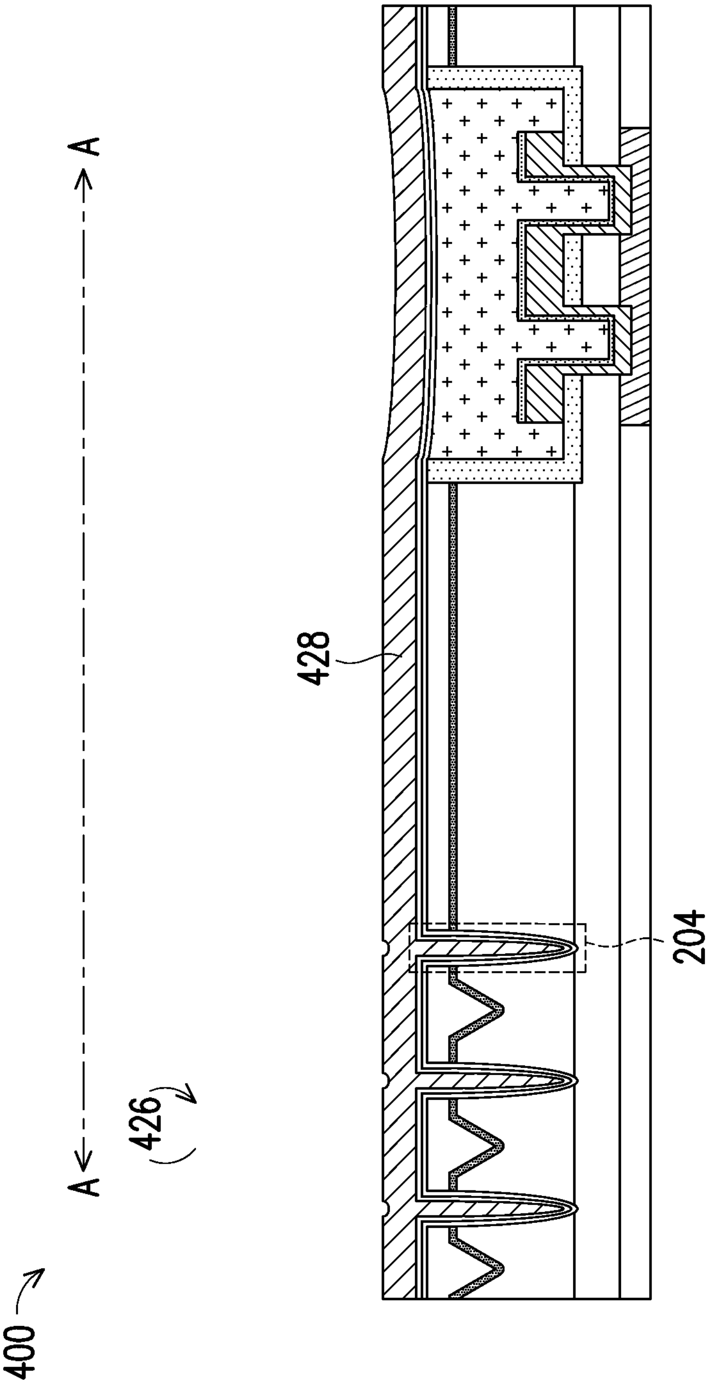

As shown in FIG. 4D and as part of the manufacturing process flow 400, one or more of the semiconductor processing tools may perform a combination of operations 426 that include filling the isolation regions 204. The combination of operations 426 may include, for example, the deposition tool depositing a conductive metal layer 428 (e.g., a conductive metal layer including a tungsten (W) material, among other examples) using a CVD technique, a PVD technique, an ALD technique, an epitaxial growth technique, and/or another similar technique.

Figure 4E:
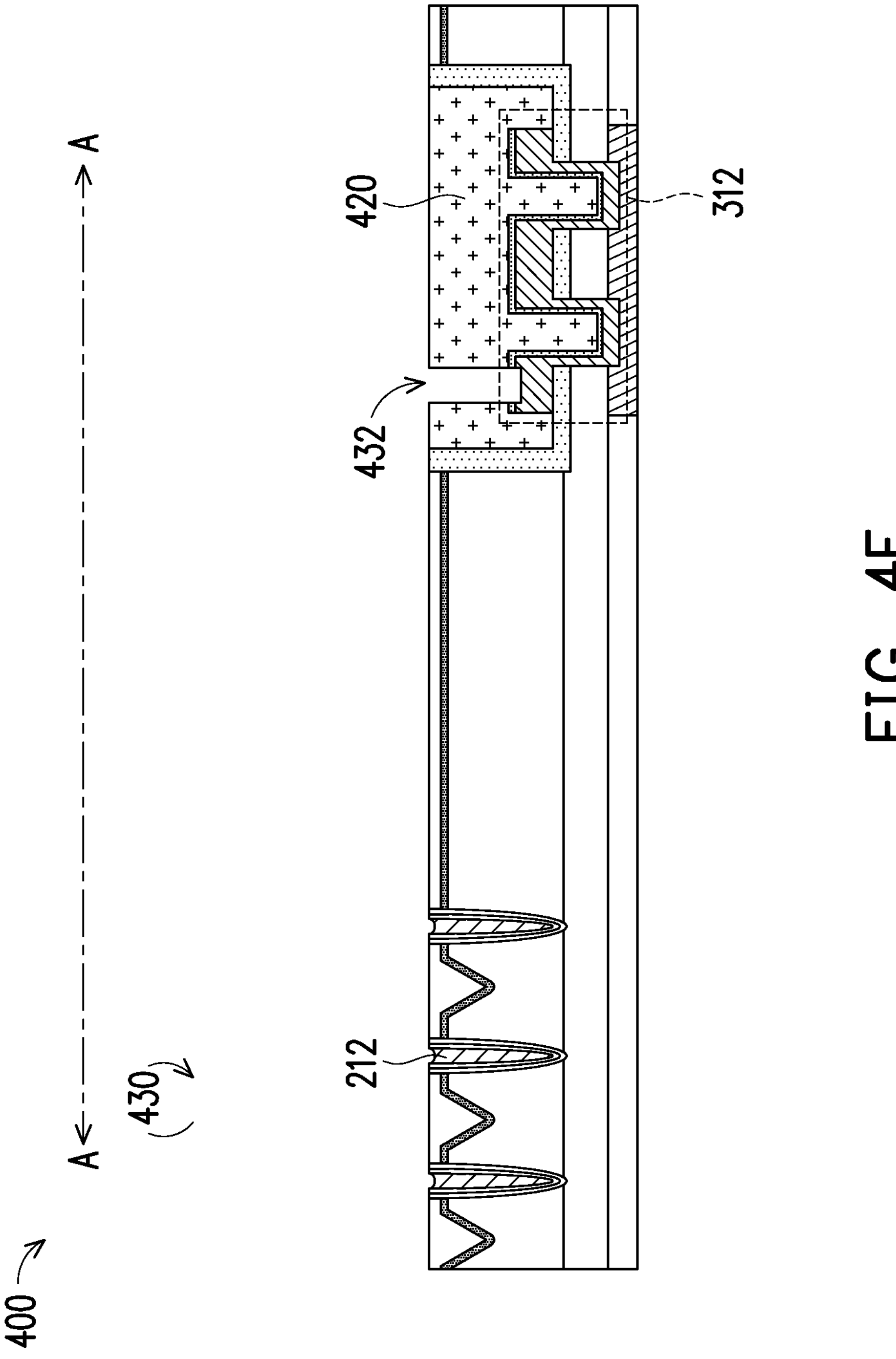

As shown in FIG. 4E and as part of the manufacturing process flow 400, one or more of the semiconductor processing tools may perform a combination of operations 430 that includes forming the metal structures 212 and a biasing pad cavity 432 that exposes the pad metal structure 312. The combination of operations 430 may include the deposition tool, the exposure tool, the developer tool, and the etch tool forming the metal structures 212 and the biasing pad cavity 432 using a combination of techniques. For example, the deposition tool may use a spin coat technique to deposit a layer of a photoresist material and the exposure tool may expose a portion of the photoresist material using a UV or EUV exposure technique, among other examples. The combination of techniques may include the developer tool using a dissolving technique to develop the layer of photoresist material through use of a chemical developer and the etch tool forming removing portions of a conductive metal layer (e.g., the conductive metal layer 428) to form the metal structures 212 using a wet etch technique, a dry etch technique, and/or a plasma-assisted etch technique, among other examples. Additionally, or alternatively, the combination of techniques may include the etch tool forming the biasing pad cavity 432 using a wet etch technique, a dry etch technique, and/or a plasma-assisted etch technique, among other examples.

Figure 4F:
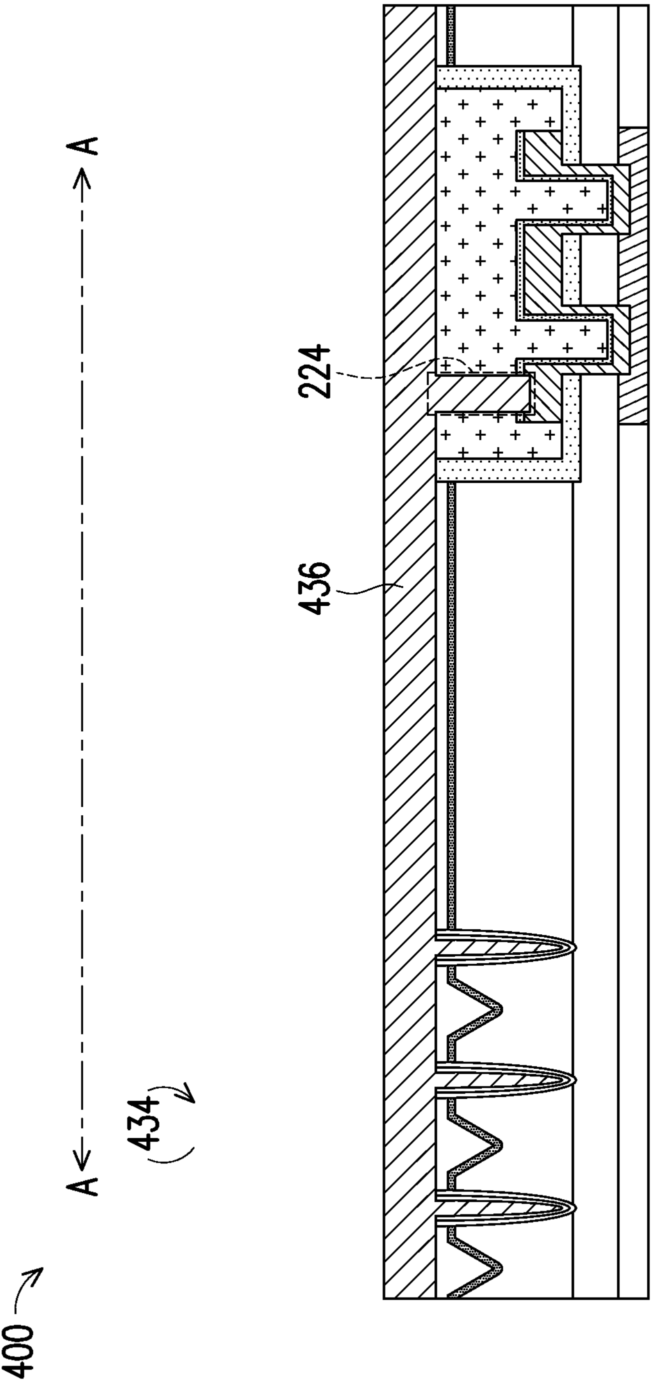

As shown in FIG. 4F and as part of the manufacturing process flow 400, one or more of the semiconductor processing tools may perform a combination of operations 434 that include filling the biasing pad cavity 432. The combination of operations 434 may include, for example, the deposition tool depositing a conductive metal layer 436 (e.g., a conductive metal layer including a tungsten (W) material, among other examples) using a CVD technique, a PVD technique, an ALD technique, an epitaxial growth technique, and/or another similar technique.

As shown in FIGS. 4A-4F, the one or more semiconductor processing operations include forming a pad metal structure 312 in a first region (e.g., the region 310) of a device (e.g., the SoC device 302) and forming an oxide layer 420 over the pad metal structure 312. The one or more semiconductor processing operations include forming an array of isolation regions (e.g., the isolation regions 204) in a second region (e.g., the region 306) of the device and forming a first metal layer (428) including portions that fill the array of isolation regions. The one or more semiconductor processing operations include forming a pad metal structure cavity 432 in the oxide layer 420 that exposes the pad metal structure 312 and forming a second metal layer 436 to form a biasing-pad structure 224 in the pad metal structure cavity 432.

As indicated above, FIGS. 4A-4F are provided as examples. Other examples may differ from what is described with regards to FIGS. 4A-4F. Additionally, or alternatively and as described in greater detail in connection with FIGS. 5-7 and elsewhere herein, additional operations may be performed to form a metal grid structure, prepare the BSI image sensor for a grid structure subsequently-formed as part of a color filter array (CFA) structure (e.g., the Low-N grid structure or another grid structure), or to form a composite grid structure.

Figure 5:
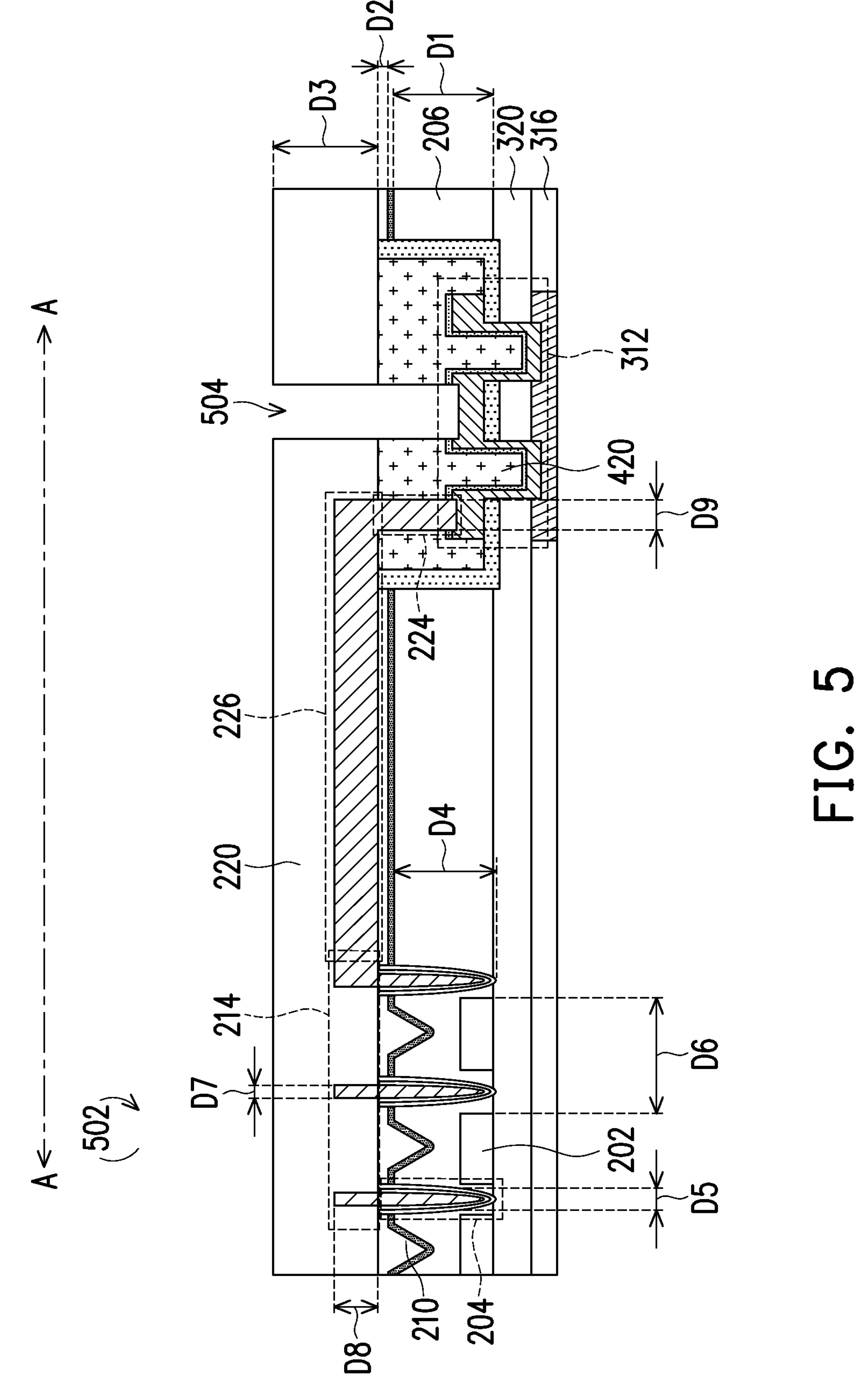

FIG. 5 is a diagram of an example manufacturing process flow 500 described herein. In some implementations, the manufacturing process flow 500 uses one or more of the semiconductor processing tools of FIG. 1 to form portions of a BSI image sensor including the semiconductor structure 200. Furthermore, FIG. 5 shows a section view A-A of the manufacturing process flow 500 corresponding to the section A-A of FIG. 2B. In some implementations, the example manufacturing process flow 500 is an extension of the manufacturing process flow 400 as described in connection with FIGS. 4A-4F. In some implementations, the manufacturing process flow 500 forms a metal grid structure (e.g., the grid structure 214 corresponding to a metal grid structure).

As shown in FIG. 5 and as part of the manufacturing process flow 500, one or more of the semiconductor processing tools may perform a combination of operations 502 to form the grid structure 214, biasing-pad structure 224, the connector structure 226, and a pad metal structure cavity 504 (e.g., a cavity for another conductive structure in addition to the biasing-pad structure 224). In some implementations, the pad metal structure cavity 504 is formed through the oxide layer 220 and the oxide layer 420 to expose the pad metal structure 312.

The combination of operations 502 may include, for example, the deposition tool depositing the oxide layer 220 using a CVD technique, a PVD technique, an ALD technique, and/or an epitaxial growth technique, or another similar technique.

Additionally, or alternatively, the combination of operations 502 may include the deposition tool, the exposure tool, the developer tool, and the etch tool forming the grid structure 214, the biasing-pad structure 224, the connector structure 226, and the pad metal structure cavity 504 using a combination of techniques. For example, the combination of techniques may include the deposition tool using a spin coat technique to deposit a layer of a photoresist material and the exposure tool exposing a portion of the photoresist material using a UV or EUV exposure technique, among other examples. The combination of techniques may include the developer tool using a dissolving technique to develop the layer of photoresist material through use of a chemical developer. The combination of techniques may include the etch tool removing portions of a conductive metal layer (e.g., the conductive metal layer 436) to form the grid structure 214, the biasing-pad structure 224, and the connector structure 226. The etch tool may use wet etch technique, a dry etch technique, and/or a plasma-assisted etch technique, among other examples. Additionally, or alternatively, the combination of techniques may include the etch tool forming the pad metal structure cavity 504 using a wet etch technique, a dry etch technique, and/or a plasma-assisted etch technique, among other examples.

Features of the portion of the example BSI image sensor, as shown in FIG. 5, may include one or more dimensional properties. For example, a thickness D1 of the silicon layer 206 may be included in a range of approximately 2 microns to approximately 10 microns. Additionally, or alternatively, a thickness D2 of the oxide layer 210 may be included in a range of approximately 1000 angstroms to approximately 2000 angstroms. Additionally, or alternatively, a thickness D3 of the oxide layer 220 may be included in a range of approximately 4000 angstroms to approximately 6000 angstroms.

In some implementations, a depth D4 of the isolation regions 204 (e.g., a BDTI structure depth) is included in a range corresponding to a portion of the thickness D1 of the silicon layer 206. For example, and for a thickness D1 of approximately 10 microns, the depth D4 may be included in a range of approximately 2 microns to approximately 6 microns. In some implementations, the depth D4 corresponds to the thickness D1 (e.g., an approximate thickness) of the silicon layer 206. For example, and for a thickness D1 of approximately 10 microns, the depth D4 may correspond to approximately 10 microns. Additionally, or alternatively, width D5 of the isolation regions 204 (e.g., a BDTI structure width) is included in a range of approximately 0.2 microns to approximately 0.4 microns.

In some implementations, a pitch D6 (e.g., spacing) between the photodiode structures 202 is included in a range of approximately 1 micron to approximately 9 microns. In some implementations, the pitch D6 may be less than approximately 1 micron.

The thicknesses D1-D3, the depth D4, the width D5, and the pitch D6 are provided as examples. However, other values and ranges for thicknesses D1-D3, the depth D4, the width D5, and the pitch D6 are within the scope of the present disclosure.

Dimensions of the grid structure 214 (e.g., the metal grid structure) may have bearing on manufacturability and/or a performance quality of the BSI image sensor. For example, and as shown in FIG. 5, a width D7 of a segment of the grid structure 214 may be included in a range of approximately 0.1 microns to approximately 0.3 microns. If width D7 is less than approximately 0.1 microns, there may be an increased risk of peeling defects in the grid structure 214. If the width is greater than approximately 0.3 microns, a size of the photodiode structures 202 may increase to reduce a resolution performance of the BSI image sensor and increase a cost of the BSI image sensor. However, other values and ranges for the width D7 are within the scope of the present disclosure.

Additionally, or alternatively, the grid structure 214 may extend a height D8 above multiple layers of the BSI image sensor (e.g., extend above the oxide layer 210 over the silicon layer 206, among other examples). The height D8 may be included in a range of approximately 1000 angstroms to approximately 3000 angstroms. If the height D8 is less than approximately 1000 angstroms, the grid structure 214 may be too short to sufficiently confine incident light (e.g., prevent cross-talk). If the height D8 is greater than approximately 3000 angstroms, there may be an increased risk of peeling defects in the grid structure 214. However, other values and ranges for the height D8 are within the scope of the present disclosure.

Dimensions of the biasing-pad structure 224 may have bearing on manufacturability of the BSI image sensor. For example, and as shown in FIG. 5, a width D9 of the biasing-pad structure 224 may be included in a range of approximately 0.3 microns to approximately 5 microns. If the width D9 is less than approximately 0.3 microns, an aspect ratio of the biasing-pad structure 224 may cause defects within the biasing-pad structure 224 during filling. If the width D9 is greater than approximately 5 microns, the BSI image sensor may suffer a size penalty (and realize a cost increase). However, other values and ranges for the width D9 are within the scope of the present disclosure.

As indicated above, FIG. 5 is provided as an example. Other examples may differ from what is described with regards to FIG. 5.

Figure 6:
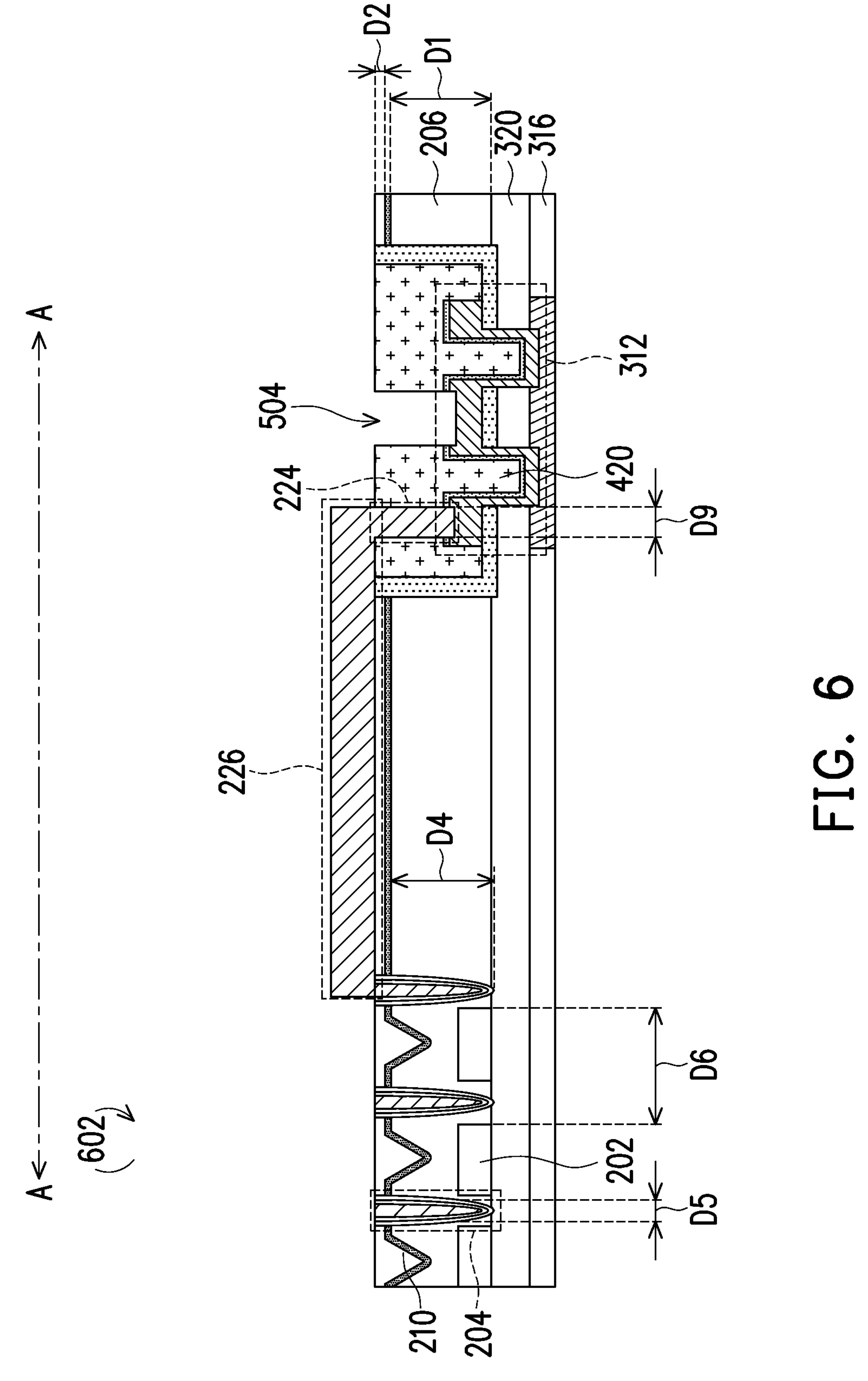

FIG. 6 is a diagram of an example manufacturing process flow 600 described herein. In some implementations, the manufacturing process flow 600 uses one or more of the semiconductor processing tools of FIG. 1 to form a portion of a BSI image sensor (e.g., a portion including the semiconductor structure 200). Furthermore, FIG. 6 shows a section view A-A of the manufacturing process flow 600 corresponding to the section A-A of FIG. 2B. In some implementations, the example manufacturing process flow 600 is an extension of the manufacturing process flow 400 as described in connection with FIGS. 4A-4F. In some implementations, the manufacturing process flow 600 prepares the portion of the BSI image sensor for a subsequently-formed grid structure (e.g., the Low-N grid structure, among other examples).

As shown in FIG. 6 and as part of the manufacturing process flow 600, one or more of the semiconductor processing tools may perform a combination of operations 602 to form the biasing-pad structure 224, the connector structure 226, and the pad metal structure cavity 504. In some implementations, the pad metal structure cavity 504 is formed through the oxide layer 420 to expose the pad metal structure 312.

The combination of operations 602 may include the deposition tool, the exposure tool, the developer tool, and the etch tool forming the biasing-pad structure 224, the connector structure 226, and the pad metal structure cavity 504 using a combination of techniques. For example, the combination of techniques may include the deposition tool using a spin coat technique to deposit a layer of a photoresist material and the exposure tool exposing a portion of the photoresist material using a UV or EUV exposure technique, among other examples. The combination of techniques may include the developer tool using a dissolving technique to develop the layer of photoresist material through use of a chemical developer. The combination of techniques may include the etch tool removing portions of a conductive metal layer (e.g., the conductive metal layer 436) to form the biasing-pad structure 224 and the connector structure 226. The etch tool may use a wet etch technique, a dry etch technique, and/or a plasma-assisted etch technique, among other examples. Additionally, or alternatively, the combination of techniques may include the etch tool forming the pad metal structure cavity 504 using a wet etch technique, a dry etch technique, and/or a plasma-assisted etch technique, among other examples.

Features of the portion of the example BSI image sensor, as shown in FIG. 6, may include one or more dimensional properties. For example, the thickness D1 of the silicon layer 206 may be included in a range of approximately 2 microns to approximately 10 microns. Additionally, or alternatively, the thickness D2 of the oxide layer 210 may be included in a range of approximately 1000 angstroms to approximately 2000 angstroms.

In some implementations, the depth D4 of the isolation regions 204 (e.g., a BDTI structure depth) is included in a range corresponding to a portion of the thickness D1 of the silicon layer 206. For example, and for a thickness D1 of approximately 10 microns, the depth D4 may be included in a range of approximately 2 microns to approximately 6 microns. In some implementations, the depth D4 corresponds to the thickness D1 (e.g., an approximate thickness) of the silicon layer 206. For example, and for a thickness D1 of approximately 10 microns, the depth D4 may correspond to approximately 10 microns. Additionally, or alternatively, width D5 of the isolation regions 204 (e.g., a BDTI structure width) is included in a range of approximately 0.2 microns to approximately 0.4 microns.

In some implementations, a pitch D6 (e.g., spacing) between the photodiode structures 202 is included in a range of approximately 1 micron to approximately 9 microns. In some implementations, the pitch D6 may be less than approximately 1 micron.

The thicknesses D1 and D2, the depth D4, the width D5, and the pitch D6 are provided as examples. However, other values and ranges for thicknesses D1-D3, the depth D4, the width D5, and the pitch D6 are within the scope of the present disclosure.

Dimensions of the biasing-pad structure 224 may have bearing on manufacturability of the BSI image sensor. For example, and as shown in FIG. 6, the width D9 of the biasing-pad structure 224 may be included in a range of approximately 0.3 microns to approximately 5 microns. If the width D9 is less than approximately 0.3 microns, an aspect ratio of the biasing-pad structure 224 may cause defects within the biasing-pad structure 224 during filling. If the width D9 is greater than approximately 5 microns, the BSI image sensor may suffer a size penalty (and realize a cost increase). However, other values and ranges for the width D9 are within the scope of the present disclosure.

As indicated above, FIG. 6 is provided as an example. Other examples may differ from what is described with regards to FIG. 6.

Figure 7:
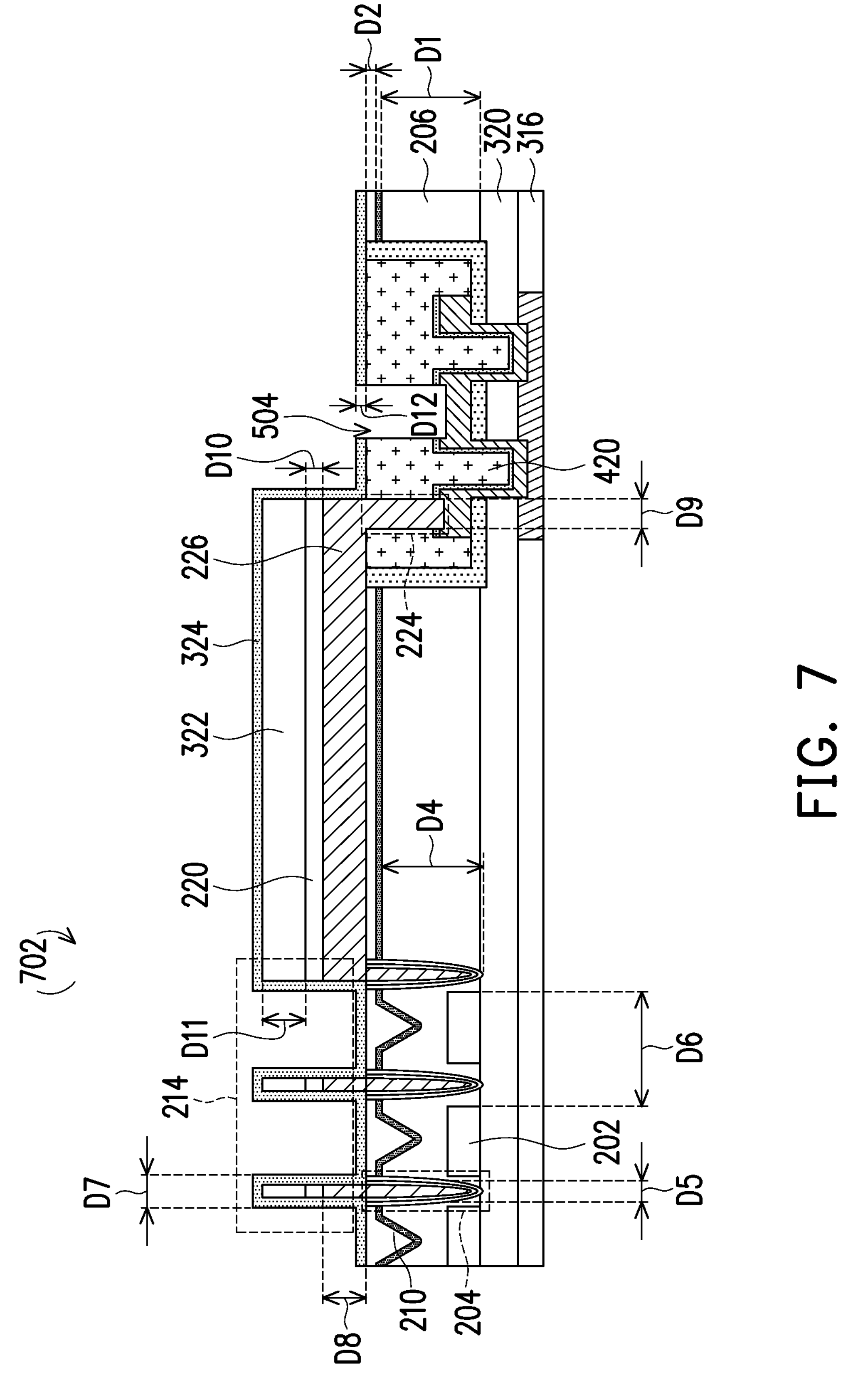

FIG. 7 is a diagram of an example manufacturing process flow 700 described herein. In some implementations, the manufacturing process flow 700 uses one or more of the semiconductor processing tools of FIG. 1 to form portions of a BSI image sensor including the semiconductor structure 200. Furthermore, FIG. 5 shows a section view A-A of the manufacturing process flow 700 corresponding to the section A-A of FIG. 2B. In some implementations, the example manufacturing process flow 700 is an extension of the manufacturing process flow 400 as described in connection with FIGS. 4A-4F. In some implementations, the manufacturing process flow 700 forms a composite grid structure (e.g., the grid structure 214 corresponding to a composite grid structure).

As shown in FIG. 7 and as part of the manufacturing process flow 700, one or more of the semiconductor processing tools may perform a combination of operations 702 to form the grid structure 214, biasing-pad structure 224, the connector structure 226, and the pad metal structure cavity 504 (e.g., a cavity for another conductive structure in addition to the biasing-pad structure 224). In some implementations, the pad metal structure cavity 504 is formed through the oxide layer 324 and the oxide layer 420 to expose the pad metal structure 312.

The combination of operations 702 may include, for example, the deposition tool depositing the oxide layer 220, the silicon oxynitride layer 322, and the oxide layer 324 using a CVD technique, a PVD technique, an ALD technique, and/or an epitaxial growth technique, or another similar technique.

Additionally, or alternatively, the combination of operations 702 may include the deposition tool, the exposure tool, the developer tool, and the etch tool forming the grid structure 214, the biasing-pad structure 224, the connector structure 226, and the pad metal structure cavity 504 using a combination of techniques. For example, the combination of techniques may include the deposition tool using a spin coat technique to deposit a layer of a photoresist material and the exposure tool exposing a portion of the photoresist material using a UV or EUV exposure technique, among other examples. The combination of techniques may include the developer tool using a dissolving technique to develop the layer of photoresist material through use of a chemical developer. The combination of techniques may include the etch tool removing portions of a conductive metal layer (e.g., the conductive metal layer 436) to form a portion of the grid structure 214, the biasing-pad structure 224, the connector structure 226, and/or removing segments of the oxide layer 220, the silicon oxynitride layer 322, or the oxide layer 324. The etch tool may use a wet etch technique, a dry etch technique, or a plasma-assisted etch technique, among other examples. Additionally, or alternatively, the combination of techniques may include the etch tool forming the pad metal structure cavity 504 using a wet etch technique, a dry etch technique, or a plasma-assisted etch technique, among other examples.

Features of the portion of the example BSI image sensor, as shown in FIG. 7, may include one or more dimensional properties. For example the thickness D1 of the silicon layer 206 may be included in a range of approximately 2 microns to approximately 10 microns. Additionally, or alternatively, the thickness D2 of the oxide layer 210 may be included in a range of approximately 1000 angstroms to approximately 2000 angstroms.

In some implementations, the depth D4 of the isolation regions 204 (e.g., a BDTI structure depth) is included in a range corresponding to a portion of the thickness D1 of the silicon layer 206. For example, and for a thickness D1 of approximately 10 microns, the depth D4 may be included in a range of approximately 2 microns to approximately 6 microns. In some implementations, the depth D4 corresponds to the thickness D1 (e.g., an approximate thickness) of the silicon layer 206. For example, and for a thickness D1 of approximately 10 microns, the depth D4 may correspond to approximately 10 microns. Additionally, or alternatively, width D5 of the isolation regions 204 (e.g., a BDTI structure width) is included in a range of approximately 0.2 microns to approximately 0.4 microns.

In some implementations, a pitch D6 (e.g., spacing) between the photodiode structures 202 is included in a range of approximately 1 micron to approximately 9 microns. In some implementations, the pitch D6 may be less than approximately 1 micron.

The thicknesses D1 and D2, the depth D4, the width D5, and the pitch D6 are provided as examples. However, other values and ranges for thicknesses D1 and D2, the depth D4, the width D5, and the pitch D6 are within the scope of the present disclosure.

Dimensions associated with the grid structure 214 (e.g., the composite grid structure) may have bearing on manufacturability and/or a performance quality of the BSI image sensor. For example, and as shown in FIG. 5, a width D7 of a segment of the grid structure 214 may be included in a range of approximately 0.1 microns to approximately 0.3 microns. If width D7 is less than approximately 0.1 microns, there may be an increased risk of peeling defects in the grid structure 214. If the width is greater than approximately 0.3 microns, a size of the photodiode structures 202 may increase to reduce a resolution performance of the BSI image sensor and increase a cost of the BSI image sensor. However, other values and ranges for the width D7 are within the scope of the present disclosure.

Additionally, or alternatively, a metal portion of the grid structure 214 may extend a height D8 above multiple layers of the BSI image sensor (e.g., extend above the oxide layer 220 over the oxide layer 210 over the silicon layer 206, among other examples). The height D8 may be included in a range of approximately 1000 angstroms to approximately 3000 angstroms. If the height D8 is less than approximately 1000 angstroms, the grid structure 214 may be too short to sufficiently confine incident light (e.g., prevent cross-talk). If the height D8 is greater than approximately 3000 angstroms, there may be an increased risk of peeling defects in the grid structure 214. However, other values and ranges for the height D8 are within the scope of the present disclosure.

Dimensions of the biasing-pad structure 224 may have bearing on manufacturability of the BSI image sensor. For example, and as shown in FIG. 7, the width D9 of the biasing-pad structure 224 may be included in a range of approximately 0.3 microns to approximately 5 microns. If the width D9 is less than approximately 0.3 microns, an aspect ratio of the biasing-pad structure 224 may cause defects within the biasing-pad structure 224 during filling. If the width D9 is greater than approximately 5 microns, the BSI image sensor may suffer a size penalty (and realize a cost increase). However, other values and ranges for the width D9 are within the scope of the present disclosure.

Additionally, or alternatively, the grid structure 214 (e.g., the composite grid structure) may include one or more dimensional properties associated with the layers on or above the metal portion of the grid structure 214. For example, the oxide layer 220 may have a thickness D10 that is included in a range of approximately 300 angstroms to approximately 800 angstroms. Additionally, or alternatively, the silicon oxynitride layer 322 may have a thickness D11 that is included in a range of approximately 1000 angstroms to approximately 3000 angstroms. Additionally, or alternatively, the oxide layer 324 may have a thickness D12 that is included in a range of approximately 1000 angstroms to approximately 2000 angstroms.

As indicated above, FIG. 7 is provided as an example. Other examples may differ from what is described with regards to FIG. 7.

Figure 8:
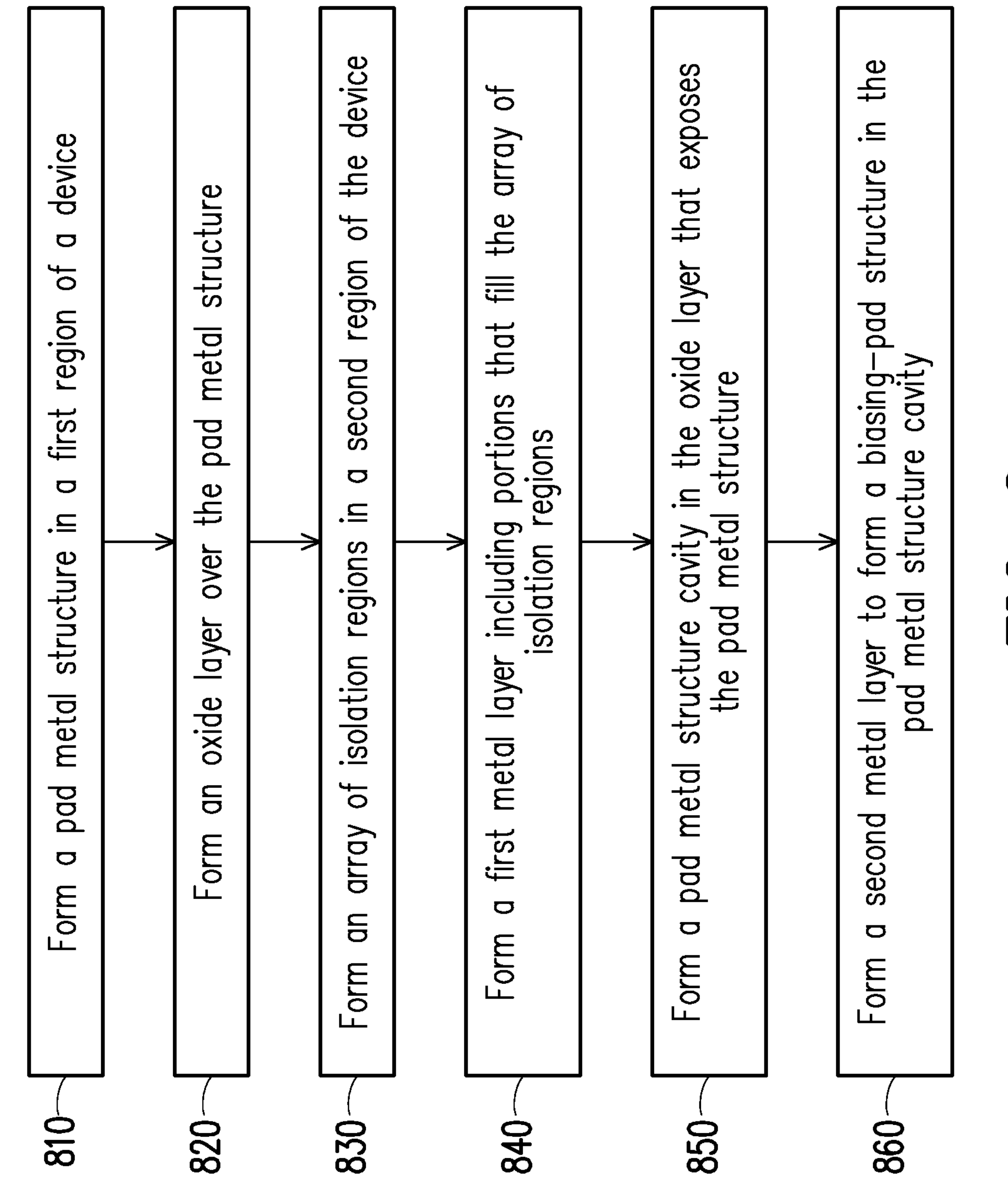
FIG. 8 is a flowchart of an example process associated with forming the semiconductor structure described herein.

FIG. 8 is a flowchart of an example process 800 associated with forming the semiconductor structure 200 described herein. In some implementations, one or more process blocks of FIG. 8 are performed by one or more of the semiconductor processing tools referenced in connection with FIGS. 4A-7. In some implementations, one or more process blocks of FIG. 8 are performed by another device or a group of devices separate from or including the one or more of the semiconductor processing tools, such as processing tools that may be included in a color filter array fabrication facility.

As shown in FIG. 8, process 800 may include forming a pad metal structure in a first region of a device (block 810). For example, the one or more of the semiconductor processing tools may form a pad metal structure 312 in a first region (e.g., the pad region 310) of a device (e.g., the SoC device 302), as described above.

As further shown in FIG. 8, process 800 may include forming an oxide layer over the pad metal structure (block 820). For example, one or more of the semiconductor processing tools may form an oxide layer 420 over the pad metal structure 312, as described above.

As further shown in FIG. 8, process 800 may include forming an array of isolation regions in a second region of the device (block 830). For example, one or more of the semiconductor processing tools may form an array of isolation regions 204 in a second region (e.g., the pixel array region 306) of the device, as described above.

As further shown in FIG. 8, process 800 may include forming a first metal layer including portions that fill the array of isolation regions (block 840). For example, one or more of the semiconductor processing tools may form a first metal layer (e.g., the conductive metal layer 428) including portions that fill the array of isolation regions 204, as described above.

As further shown in FIG. 8, process 800 may include forming a pad metal structure cavity in the oxide layer that exposes the pad metal structure (block 850). For example, one or more of the semiconductor processing tools may form a pad metal structure cavity (e.g., the biasing pad cavity 432) in the oxide layer 420 that exposes the pad metal structure 312, as described above.

As further shown in FIG. 8, process 800 may include forming a second metal layer to form a biasing-pad structure in the pad metal structure cavity (block 860). For example, one or more of the semiconductor processing tools may form a second metal layer (e.g., the conductive metal layer 436) to form a biasing-pad structure 224 in the pad metal structure cavity, as described above.

Process 800 may include additional implementations, such as any single implementation or any combination of implementations described below and/or in connection with one or more other processes described elsewhere herein.

In a first implementation, process 800 includes forming a grid structure 214 that electrically connects the biasing-pad structure 224 to the portions of the first metal layer that fill the array of isolation regions 204.

In a second implementation, alone or in combination with the first implementation, forming the grid structure 214 includes removing portions of the second metal layer.

In a third implementation, alone or in combination with one or more of the first and second implementations, the oxide layer 420 corresponds to a first oxide layer and further includes forming a second oxide layer (e.g., the oxide layer 220) on the grid, a silicon oxynitride layer 322 on the second oxide layer, and a third oxide layer (e.g., the oxide layer 324) on the silicon oxynitride layer 322.

In a fourth implementation, alone or in combination with one or more of the first through third implementations, the pad metal structure cavity corresponds to a first pad metal structure cavity and further including forming a second pad metal structure cavity (e.g., the pad metal structure cavity 504) through the third oxide layer and the first oxide layer to expose the pad metal structure 312.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein provide for techniques to form a biased backside deep trench isolation (BDTI) and grid structure for a backside illumination images (BSI) sensor. The techniques include forming an array of BDTI structures and a biasing-pad structure that electrically connects the array of BDTI structures through the grid structure. The array of BDTI structures, the grid structure, and the biasing-pad structure may reduce a likelihood of electrical cross-talk and/or oblique light cross-talk between the photodiodes of the BSI image sensor.

In this way, a performance of a BSI image sensor may be improved. Such improvements may include a suppression of a dark current within the BSI image sensor, a reduction in a number of white pixels, and a reduction in cross-talk within the BSI image sensor.

As described in greater detail above, some implementations described herein provide a device. The device includes an array of photodiode structures. The device includes an array of metal structures dispersed between the array of photodiode structures. The device includes a biasing-pad structure electrically connected with the array of metal structures through a grid structure.

As described in greater detail above, some implementations described herein provide a device. The device includes a backside deep trench isolation structure including an isolation region extending through multiple layers and a metal structure filling the isolation region. The device includes a biasing-pad structure. The device includes a grid structure that electrically-connects the metal structure and the biasing-pad structure.

As described in greater detail above, some implementations described herein provide a method. The method includes forming a pad metal structure in a first region of a device. The method includes forming an oxide layer over the pad metal structure. The method includes forming an array of isolation regions in a second region of the device. The method includes forming a first metal layer including portions that fill the array of isolation regions. The method includes forming a pad metal structure cavity in the oxide layer that exposes the pad metal structure. The method includes forming a second metal layer to form a biasing-pad structure in the pad metal structure cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

an array of photodiode structures;

an array of inverted pyramid structures;

an array of metal structures dispersed between the array of photodiode structures, wherein at least one metal structure of the array of metal structures extends through a portion of a flat segment of the array of inverted pyramid structures connecting inverted pyramid structures of the array of inverted pyramid structures; and a biasing-pad structure electrically connected with the array of metal structures through a grid structure, wherein the grid structure extends above the array of metal structures in a range of approximately 1000 angstroms to 3000 angstroms.

2. The device of claim 1, further comprising:

a color filter array region above the grid structure.

3. The device of claim 1, further comprising:

a connector structure, wherein the array of photodiode structures is located within a pixel array region of the device, wherein the biasing-pad structure is located within a pad region of the device, wherein a periphery region of the device separates the pixel array region and the pad region, and wherein the connector structure spans across the periphery region as part of an electrical connection between the biasing-pad structure and the array of metal structures.

4. The device of claim 1, wherein the grid structure corresponds to a composite grid structure comprising:

a metal material;

a first dielectric material on the metal material;

a second dielectric material on the first dielectric material; and a third dielectric material on the second dielectric material.

5. The device of claim 4, wherein the first dielectric material corresponds to a first oxide material, the second dielectric material corresponds to a silicon oxynitride material, and the third dielectric material corresponds to a second oxide material.

6. The device of claim 1, wherein at least a portion of the at least one metal structure extends into an isolation region extending into a silicon layer.

7. The device of claim 1, wherein the array of metal structures extends above the array of inverted pyramid structures.

8. A device, comprising:

a backside deep trench isolation structure comprising:

an array of inverted pyramid structures;

an isolation region, extending through multiple layers, wherein at least a portion of the isolation region extends through a flat segment of the array of inverted pyramid structures connecting inverted pyramid structures of the array of inverted pyramid structures; and a metal structure filling the isolation region;

a biasing-pad structure; and a connector structure and a metal shield structure that electrically connect the metal structure and the biasing-pad structure.

9. The device of claim 8, wherein the metal structure comprises:

a top surface that is substantially coplanar with top edges of the isolation region.

10. The device of claim 8, wherein the isolation region comprises an interior surface lined with an oxide layer and a dielectric layer.

11. The device of claim 8, wherein the multiple layers comprise:

a silicon layer, and wherein the isolation region extends into the silicon layer to a depth that corresponds to an approximate thickness of the silicon layer.

12. The device of claim 8, wherein the multiple layers comprise:

a silicon layer, and wherein the isolation region extends into the silicon layer to a depth that corresponds to a portion of an approximate thickness of the silicon layer.

13. The device of claim 8, further comprising:

a grid structure that electrically connects the metal structure and the biasing-pad structure, wherein the grid structure corresponds to a metal grid structure that extends above the multiple layers.

14. The device of claim 8, wherein the multiple layers comprise:

an oxide layer over a dielectric layer over a silicon layer.

15. The device of claim 8, wherein the multiple layers comprise:

a silicon layer under a dielectric layer under a first oxide layer under a second oxide layer.

16. A device, comprising:

an array of photodiode structures, with isolation regions between the photodiode structures, wherein a single inverted pyramid structure is above each photodiode structure, of the array of photodiode structures, along a first direction, and wherein the single inverted pyramid structure is between two isolation regions, of the isolation regions, along the first direction;

an array of metal structures in the isolation regions, wherein at least one metal structure of the array of metal structures extends through a portion of a flat segment of the array of inverted pyramid structures connecting inverted pyramid structures of the array of inverted pyramid structures;

a biasing-pad structure; and a connector structure that forms at least a portion of an electrical connection between the biasing-pad structure and the array of metal structures.

17. The device of claim 16, wherein each metal structure, of the array of metal structures, has a top surface that is substantially coplanar with top edges of the isolation regions.

18. The device of claim 16, wherein the isolation regions extend through multiple layers.

19. The device of claim 16, further comprising:

a grid structure that electrically connects the connector structure and the array of metal structures.

20. The device of claim 19, wherein the grid structure is a composite grid structure comprising multiple layers of material over each metal structure of the array of metal structures.

* * * * *